United States Patent
Yoshii et al.

(10) Patent No.: US 10,203,128 B2
(45) Date of Patent: Feb. 12, 2019

(54) COLD WATER CIRCULATION SYSTEM WITH CONTROL OF SUPPLY OF COLD WATER BASED ON DEGREE OF AIR HANDLER SURPLUS

(71) Applicant: NTT FACILITIES, INC., Tokyo (JP)

(72) Inventors: Ari Yoshii, Tokyo (JP); Shinichiro Kaneko, Tokyo (JP); Kanji Tashiro, Tokyo (JP)

(73) Assignee: NTT FACILITIES, INC., Tokyo (JP)

( * ) Notice: Subject to any disclaimer, the term of this patent is extended or adjusted under 35 U.S.C. 154(b) by 663 days.

(21) Appl. No.: 14/655,846

(22) PCT Filed: Dec. 26, 2013

(86) PCT No.: PCT/JP2013/084864
§ 371 (c)(1),
(2) Date: Jun. 26, 2015

(87) PCT Pub. No.: WO2014/104182
PCT Pub. Date: Jul. 3, 2014

(65) Prior Publication Data
US 2015/0354851 A1 Dec. 10, 2015

(30) Foreign Application Priority Data
Dec. 28, 2012 (JP) .................................. 2012-287606

(51) Int. Cl.
*F24F 11/83* (2018.01)
*H05K 7/20* (2006.01)
(Continued)

(52) U.S. Cl.
CPC ............ *F24F 11/83* (2018.01); *F24F 5/0003* (2013.01); *H05K 7/2079* (2013.01); *F24F 3/06* (2013.01)

(58) Field of Classification Search
CPC .......... F24F 1/0007; F24F 3/06; F24F 5/0003; F24F 11/06; F24F 11/0009;
(Continued)

(56) References Cited

U.S. PATENT DOCUMENTS 5,316,073 A * 5/1994 Klaus ................... F24F 11/0009
165/11.1
5,533,348 A * 7/1996 Baldwin .............. F24F 11/0009
236/DIG. 19
(Continued)

FOREIGN PATENT DOCUMENTS

JP     H03-195851 A    8/1991
JP     H08-75224 A     3/1996
(Continued)

OTHER PUBLICATIONS

JP 2007-205604 (English Translation).*
(Continued)

*Primary Examiner* — Jonathan Bradford
(74) *Attorney, Agent, or Firm* — Withrow & Terranova, P.L.L.C.; Vincent K. Gustafson

(57) ABSTRACT

A chilled water circulation system includes a thermal source, an AHU, a pump, and a control section. The thermal source chills water to a specified temperature. The AHU cools air by heat exchange with the chilled water. The pump feeds the chilled water having a flow rate corresponding to an operating frequency of a power inverter to the AHU. The control section calculates a degree of surplus, which indicates surplus capacity of the AHU to cool air, on the basis of information indicating the state of the AHU. If the degree of surplus is not lower than the specified threshold, the control section controls the operating frequency of the power inverter, thereby decreasing the flow rate of the chilled water fed from the pump. If the degree of surplus is lower than the
(Continued)

specified threshold, the control section increases the flow rate of the chilled water fed from the pump.

17 Claims, 5 Drawing Sheets

(51) Int. Cl.
*F24F 5/00* (2006.01)
*F24F 3/06* (2006.01)

(58) Field of Classification Search
CPC ....... F24F 2011/0045; F24F 2011/0046; F24F 2011/0047; F24F 2011/0061; F24F 2011/0075; F24F 2011/0083
See application file for complete search history.

(56) References Cited

U.S. PATENT DOCUMENTS

| | | | |
|---|---|---|---|
| 2007/0107450 A1 | 5/2007 | Sasao et al. | |
| 2012/0042674 A1 | 2/2012 | Takenaka et al. | |
| 2013/0199772 A1* | 8/2013 | Fischer | F28F 27/00 165/287 |

FOREIGN PATENT DOCUMENTS

| | | |
|---|---|---|
| JP | 2004101087 A | 4/2004 |
| JP | 2004286299 A | 10/2004 |
| JP | 2006038379 A | 2/2006 |
| JP | 2007139241 A | 6/2007 |
| JP | 2007-205604 A | 8/2007 |
| JP | 2007315695 A | 12/2007 |
| JP | 4333818 B2 | 9/2009 |
| JP | 4406778 B2 | 2/2010 |
| JP | 2010-270967 A | 12/2010 |
| JP | 4748175 B2 | 8/2011 |
| JP | 2011163665 A | 8/2011 |
| JP | 2011-179755 A | 9/2011 |
| JP | 2011247560 A | 12/2011 |
| WO | 2010131378 A1 | 11/2010 |

OTHER PUBLICATIONS

Decision of Rejection for Japanese Patent Application No. 2012-287606, dated Nov. 29, 2016, 5 pages (including English translation).
First Office Action for Chinese Patent Application No. 2013800685638, dated Jan. 16, 2017, 17 pages (including English translation).
International Search Report for International Application No. PCT/JP2013/084864 (Form PCT/ISA/210), dated Apr. 1, 2014, 2 pages.
International Preliminary Report on Patentability (including forms PCT/IB/338, PCT/IB/373, PCT/ISA/237) for International Application No. PCT/JP2013/084864, dated Jul. 9, 2015, 8 pages.
Notice of Reason(s) for Rejection for Japanese Patent Application No. 2012-287606, dated Jun. 7, 2016, 10 pages (including English translation).

* cited by examiner

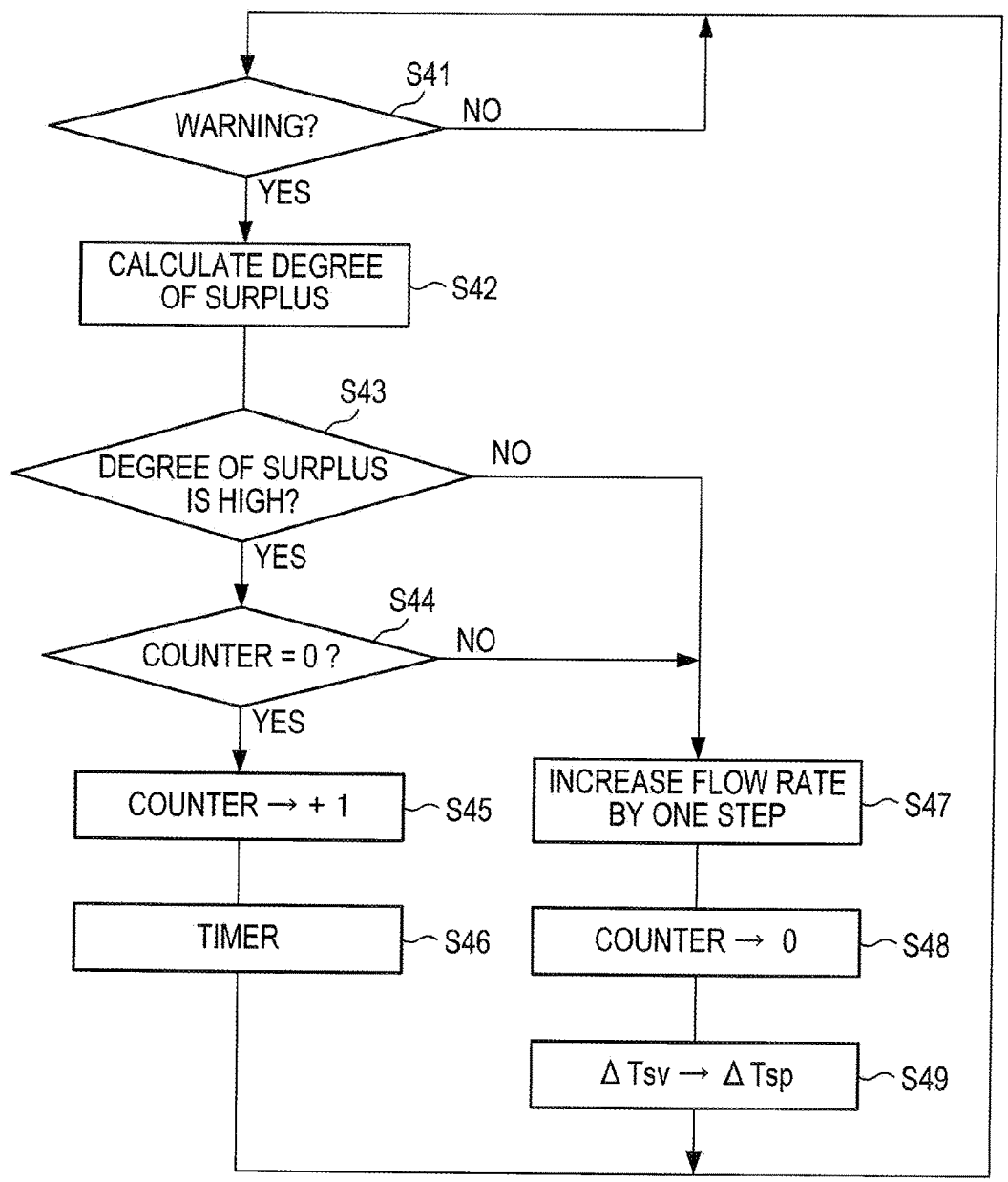

COLD WATER CIRCULATION SYSTEM WITH CONTROL OF SUPPLY OF COLD WATER BASED ON DEGREE OF AIR HANDLER SURPLUS

CROSS-REFERENCE TO RELATED APPLICATIONS

This application is a 35 U.S.C. § 371 national phase filing of International Application No. PCT/JP2013/084864, filed Dec. 26, 2013, and claims the benefit of Japanese Patent Application No. 2012-287606 filed on Dec. 28, 2012 in the Japan Patent Office. The entire disclosures of International Application No. PCT/JP2013/084864 and Japanese Patent Application No. 2012-287606 are hereby incorporated by reference herein in their respective entireties.

TECHNICAL FIELD

The present invention relates to a cold/chilled water circulation system that supplies chilled water used for air conditioning.

BACKGROUND ART

An air conditioning system utilizing a central thermal source unit is widely used; which uses, as cold heat, cold/chilled water supplied by a chilled water circulation system.

In the foregoing air conditioning system, a primary return header and a primary feed header are connected to a plurality of thermal sources that supply chilled water, and the chilled water is fed from the primary return header, via the thermal sources, to the primary feed header by a primary pump. Additionally, a secondary feed header and a secondary return header are connected to a plurality of AHUs (Air Handling Units) that cool air by use of the chilled water. Disposed between the primary feed header and secondary feed header is a secondary pump that feeds the chilled water from the primary feed header to the secondary feed header. As an example of the secondary pump, one that is inverter-controlled is known. Connections are made so that the chilled water flows into the primary return header from the secondary return header.

As a method for controlling the flow rate of chilled water circulating in the air conditioning system, a method for controlling the flow rate of chilled water by performing control such that the pressure of chilled water discharged from the foregoing secondary pump is made equal to a specified set value is known. As described in Patent Documents 1, 2, another method is also known, in which the flow rate of chilled water fed out from a secondary pump is controlled such that a main-pipe temperature difference, which is the difference between the feed temperature, i.e., the temperature of chilled water fed out from a secondary feed header, and the return temperature, i.e., the temperature of the chilled water flowing into a secondary return header, is equal to a specified value.

In the techniques described in the Patent Documents 1, 2, only the flow rate of chilled water required in AHUs is provided. Accordingly, power for conveying chilled water can be reduced, that is, power consumed by the secondary pump can be reduced. Additionally, even if thermal load in the AHUs drops, the flow rate of chilled water is controlled such that the difference between the feed temperature and return temperature is maintained at the specified value. In other words, even if the return temperature decreases, control is performed so as to increase the return temperature. Accordingly, the operating efficiency of thermal sources can be maintained. Additionally, a sensor required for the foregoing control is a temperature sensor only. Since the need for a pressure sensor is therefore obviated, manufacturing costs can be reduced.

Patent Document 3 discloses control for increasing, on the basis of an alarm output from a specific AHU, the flow rate of chilled water fed out from a secondary pump. As an example of the alarm, one indicating that thermal load in the specific AHU has increased can be given. This control can inhibit an increase in room temperature or the like, resulting from insufficient capacity of the AHU.

PRIOR ART DOCUMENTS

Patent Documents
  Patent Document 1: Japanese Patent No. 4406778
  Patent Document 2: Japanese Patent No. 4333818
  Patent Document 3: Japanese Patent No. 4748175

SUMMARY OF THE INVENTION

Problems to be Solved by the Invention

In a case where the air conditioning system described above is used in a data center, high reliability is required in capacity to adjust temperature compared to a case where the air conditioning system is used in other facilities. Therefore, the air conditioning system installed in the data center is provided with a standby machine for the AHUs in order to ensure the reliability of the air conditioning system. The backup machine is designed so as to stand by in an immediately operable state when necessary (i.e., the backup machine is made to hot-stand by).

Therefore, the air conditioning system is operated to sufficiency using a sufficient number of AHUs and including sufficient capacity to adjust room air-temperature. Accordingly, the air conditioning system can ensure reliability in adjusting temperature, thus enabling stable temperature management.

However, there has been a problem in that control for altering the pressure set value described above or control for maintaining the main-pipe temperature difference at a specified value, which are performed to reduce power consumed by the air conditioning system (i.e., to save energy), decrease the flow rate of cold/chilled water supplied to the AHUs, with the result that the sufficient capacity to adjust room air-temperature cannot be ensured.

There has been another problem in that, in a case where the load factor of the air conditioning system is low or in a case where the flow rate of chilled water fed out under the inverter control of the primary pump is controlled, the energy saving effect is limited even though control for maintaining the main-pipe temperature difference at the specified value is performed.

Specifically, the problem is as follows: in a case where the primary pump is inverter controlled, the air conditioning system can be operated by a large temperature difference greater than a rated temperature difference; however, it is difficult for a return temperature, which is the temperature of chilled water that has returned from the AHUs, to reach or exceed an outlet temperature (which is the temperature of chilled water released from the thermal sources)+the rated temperature difference; as a result, the operating efficiency of the thermal source is not increased, making it difficult to obtain the energy saving effect. An example of the case where the load factor of the air conditioning system is low can include a case where outside air temperature is low, a case where a quantity of heat generated in the data center is small, or a case where the air conditioning capacity of the air conditioning system is excessive.

Even the control to adjust the flow rate of chilled water on the basis of an alarm described in the Patent Document 3 suffers from a problem in that it is difficult to obtain the energy saving effect. In a case where the temperature of a room where AHUs are arranged has become high, some of the air conditioning systems perform control, for example, such that, a two-way valve for controlling the flow rate of chilled water supplied to the AHUs is opened to increase the flow rate of the chilled water, or the rotation number of fans is increased to increase the flow rate of air in the room, which is heat exchanged by the AHUs.

In the technique in the Patent Document 3, when an alarm is given during the foregoing control in the AHUs due to high room temperature, there is a possibility that control is performed, regardless of the control of the AHUs, such that the flow rate of chilled water fed out from the secondary pump is increased. In other words, even in a transitional situation where the capacity of the AHUs to adjust temperature is sufficient and in a case where the room temperature can be adjusted without altering the flow rate of the chilled water fed out from the secondary pump, there is a possibility that control may be performed on the basis of the alarm, to increase the flow rate of the chilled water fed out from the secondary pump. Consequently, the flow rate of chilled water fed out from the secondary pump may unnecessarily be increased, leading to a problem in which the energy saving effect of the air conditioning system decreases.

One aspect of the present invention is to provide a chilled water circulation system that ensures reliability in adjusting temperature and that is able to reduce power consumed.

Means for Solving the Problems

A cold/chilled water circulation system according to one aspect of the present invention comprises: a thermal source that cools chilled water to a specified temperature; at least one AHU, which is an air conditioner that cools air by heat exchange with the chilled water; a pump that feeds the chilled water from the thermal source to the AHU, the chilled water having a flow rate corresponding to an operating frequency of a power inverter; and a control section configured such that a degree of surplus, indicating the surplus capacity of the AHU to cool air, is calculated on the basis of information indicating the state of the AHU, if the degree of surplus is equal to or higher than a specified threshold, operating frequency of the power inverter is controlled, thereby decreasing the flow rate of the chilled water fed out from the pump, and if the degree of surplus is smaller than the specified threshold, the flow rate of the chilled water fed out from the pump is increased.

According to the chilled water circulation system according to the present invention, since the pump is controlled based on a degree of surplus of the AHU, surplus capacity of the AHU to cool air can be ensured, and the reliability of the capacity to adjust room air-temperature can be ensured.

Additionally, if the degree of surplus is equal to or greater than the specified threshold, control to decrease the flow rate of the chilled water fed out from the pump is performed, thus making it possible to reduce power used for driving the pump. Furthermore, since the flow rate of the chilled water fed out from the pump decreases, the temperature of the chilled water returning from the AHU is likely to increase, thus making it easy to improve the efficiency of the thermal source.

In the foregoing invention, information indicating the state of the AHU is preferably at least one or more of the following: a degree of opening of a two way valve that controls the chilled water flowing into the AHU, a rotating frequency of a fan that blows the air to be heat-exchanged in the AHU, or an air temperature difference between a temperature set for the air released from the AHU and a measured temperature of the air, or a combination thereof.

As described above, obtaining a degree of surplus by using at least one of the following: a degree of opening of the two-way valve, a rotating frequency of the fan, or an air temperature difference, makes it yet easier to ensure reliability, thus facilitating a decrease in power used for driving a secondary pump. That is, it is considered that the capacity of the AHU to cool air correlates with the degree of opening of the two-way valve, and that a surplus up to a full-open state in the degree of opening correlates with the degree of surplus described above. Therefore obtaining the degree of surplus by using the degree of opening of the two-way valve makes it possible to obtain the degree of surplus with higher accuracy. Similarly, it is considered that the rotating frequency of the fan and the air temperature difference correlate with the capacity of the AHU to cool air. Therefore, obtaining the degree of surplus by using the rotating frequency of the fan and the temperature difference makes it possible to obtain the degree of surplus with higher accuracy.

In the foregoing invention, it is preferable that the degree of opening of the two-way valve be controlled such that an outlet temperature, which is the measured temperature of the air released from the AHU, is equal to a desired value set for the outlet temperature.

By controlling the degree of opening of the two-way valve such that an outlet temperature, which is the temperature of air released from the AHU, is equal to a desired value set for the outlet temperature as described above, the outlet temperature is easily controlled so as to have the value set for the outlet temperature. Specifically, if the outlet temperature is higher than the value set for the outlet temperature, control is performed so as to increase the degree of opening of the two-way valve. Thereby, the flow rate of chilled water supplied to the AHU is increased and, therefore, the outlet temperature is decreased. Accordingly, the temperature of air released from the AHU is easily controlled so as to have the value set for the outlet temperature. Conversely, if the outlet temperature is lower than the value set for the outlet temperature, control is performed so as to decrease the degree of opening of the two-way valve. Thereby, the flow rate of chilled water supplied to the AHU is decreased and, therefore, the outlet temperature is increased. Accordingly, the temperature of air released from the AHU is easily controlled so as to have the value set for the outlet temperature.

In the foregoing invention, it is preferable that the operating frequency of the fan be controlled such that the temperature in a specific section where the AHU is arranged is lower than a specified set threshold.

By controlling the rotating frequency of the fan such that the temperature in the section is lower than the specified set threshold, as described above, the temperature in the section is easily controlled so as to be lower than the set threshold. Specifically, if the temperature in the section is higher than the set threshold, the rotating frequency of the fan is increased. Thereby, the flow rate of air released from the AHU increases, so that the temperature in the section is easily made lower than the set threshold. While the outlet temperature is stabilized in such a manner, the fan is operated at the lowest frequency so that the temperature in the room is equal to or less than a set level. Thereby, fan power can also be reduced.

In the foregoing invention, it is preferable that a plurality of AHUs be provided, and the AHUs be separately arranged in a plurality of sections. It is also preferable that the control section be configured to perform control such that when at least either the respective degrees of opening of the two-way valves or the respective rotating frequencies of the fans satisfy corresponding upper limit thresholds in all the AHUs arranged in the sections, the flow rate of the chilled water fed out from the pump is increased.

In the foregoing invention, it is preferable that the plurality of AHUs be provided, and the AHUs be separately arranged in a plurality of sections. It is also preferable that the control section be configured to perform control such that when at least either the respective degrees of opening of the two-way valves or the respective rotating frequencies of the fans satisfy corresponding upper limit thresholds in a certain number of the AHUs arranged in the sections, the flow rate of the chilled water fed out from the pump is increased.

As described above, only when at least either the respective degrees of opening of the two-way valves or the respective rotation frequencies of the fans satisfy the corresponding upper limit thresholds in all the AHUs or in a certain number of the AHUs, control for increasing the flow rate of chilled water fed out from each pump may be performed. In this way, power used for driving the pumps is easily reduced. That is, the period for which the flow rate of chilled water is increased is shortened, compared to the case where control is performed such that at least either the degree of opening of the two-way valve or the rotating frequency of the fan satisfies the corresponding upper limit threshold in one AHU, the flow rate of the chilled water fed out from the pump is increased. Accordingly, power used for driving the pump can be reduced.

In the foregoing invention, it is preferable that a temperature sensor that measures the temperature in a room be provided and preferable for the control section to perform control such that if the temperature in the room measured by the temperature sensor exceeds a temperature threshold, the flow rate of the chilled water fed out from the pump is increased.

As described above, control is performed such that if the temperature in the room exceeds the temperature threshold, the flow rate of the chilled water fed out from the pump is increased, thereby making the temperature in the room less likely to exceed an alarm threshold. For example, if control for increasing the flow rate of chilled water after the temperature in the room exceeds the alarm threshold, which is higher than the temperature threshold is performed, the temperature in the room may exceed the alarm threshold. Compared to this, by performing control for increasing the flow rate of chilled water after the temperature in the room exceeds the temperature threshold, the temperature in the room can be made less likely to exceed the alarm threshold.

In the foregoing invention, it is preferable for the control section to perform control such that, if the degree of surplus is not lower than the specified threshold even after the temperature in the room measured by the temperature sensor exceeds the temperature threshold, the flow rate of the chilled water fed out from the pump is increased after the lapse of a specified period.

If the degree of surplus is not lower than the specified threshold even after the room air-temperature exceeds the temperature threshold as described above, power used for driving the pump is easily reduced by performing the control for increasing the flow rate of the chilled water after a time interval of a specified period. For example, if the two-way valve of each of the AHUs opens and the room air-temperature decreases below the temperature threshold due to provision of a time interval of the specified period, control for increasing the flow rate of the chilled water from the pump is not performed. Therefore, compared to the case where the flow rate of chilled water is increased without providing the specified period, power used for driving the pump is reduced.

In the foregoing invention, it is preferable for the control section to perform control such that if the room air-temperature measured by the temperature sensor exceeds the alarm threshold, which is higher than the temperature threshold, a target temperature for the chilled water cooled by the thermal source is altered to a specific temperature, which is lower than the specified temperature.

As described above, if the room air-temperature exceeds the alarm threshold, the target temperature of chilled water cooled by the thermal source is immediately altered to the specific temperature, thereby making it possible to immediately decrease the room air-temperature to below the alarm threshold.

It is preferable for the control section to perform control such that in a case where the operating frequency of the power inverter is controlled so that a target pressure for the chilled water fed out from the pump is equal to a specified pressure, the flow rate of the chilled water is increased or decreased by altering a pressure setting, instead of controlling the operating frequency of the power inverter. As described above, by altering the setting of the target pressure instead of controlling the operating frequency of the power inverter, the flow rate of the chilled water fed out from the pump is easily controlled.

In the foregoing invention, it is preferable for the control section to perform control such that the operating frequency of the power inverter is controlled so that the target pressure of the chilled water fed out from the pump is equal to the specified pressure, to perform control for decreasing the flow rate of the chilled water by altering the specified pressure after a specified interval of control, and to store the specified pressure after the alteration.

As described above, by repeatedly storing the specified pressure used when the flow rate of chilled water is decreased, i.e., by repeatedly learning the specified pressure, power used for driving the pump can be decreased, compared to the case where learning is not repeated.

In the foregoing invention, it is preferable for the control section to perform control such that the operating frequency of the power inverter is controlled so that a target value for a chilled water temperature difference between a feed temperature, which is the temperature of the chilled water fed to the AHUs, and a return temperature, which is the temperature of the chilled water flowing out from the AHUs, is equal to a specified temperature difference, and such that control for decreasing the flow rate of the chilled water is performed by altering the specified temperature difference after a specified interval of control and the specified temperature difference after the alteration is stored.

As described above, by repeatedly storing the specified temperature difference used when the flow rate of chilled water is decreased, i.e., by repeatedly learning the specified temperature difference, power used for driving the secondary pump can be decreased, compared to the case where learning is not repeated.

In the foregoing invention, it is preferable that the degree of surplus be at least one of the following: 1−(the average value of the degrees of opening of the two-way valves); 1−[the average value of (the rotating frequencies of the fans/the maximum frequency)]; or the average value of (the set temperatures—the measured temperatures).

Obtaining the degree of surplus as described above makes it possible to express the degree of surplus as a numeric value of 0 to 1 on the basis of the degrees of opening of the two-way valves or the rotating frequencies of the fans. By virtue of this, a control process, such as comparing a degree of surplus with a specified threshold, after the degree of surplus is obtained does not have to be altered according to the type of information indicating the state of the AHUs.

In the foregoing invention, it is preferable that the plurality of AHUs be arranged separately in a sectioned space, and the degree of surplus be obtained on the basis of the AHUs arranged in each of the sections.

As described above, obtaining the degree of surplus for each section and controlling the flow rate of chilled water fed out from the pump make it easy to ensure the reliability of the capacity to adjust the room-air temperature. For example, even if the degree of surplus, obtained from one of the sections, is determined to be lower than a specified threshold, control for increasing the flow rate of chilled water is performed, thereby making it easy to restrict increase in the room air-temperature in the section.

In the foregoing invention, if the degree of surplus is 1−(the average value of the degrees of opening of the two-way valves), or 1−[the average value of (the rotating frequencies of the fans/the maximum frequency)], the specified threshold of the degree of surplus is preferably set to (the number of AHUs for normal use/(the number of AHUs for normal use+the number of AHUs for backup use).

As described above, specifying the specified threshold based on the number of AHUs for normal use and the number of AHUs for backup use makes it easy to further ensure the reliability of the capacity to adjust the room air-temperature. Herein, the number of AHUs for normal use refers to the minimum number of AHUs required to cope with load in the air conditioning system equipped with the chilled water circulation system, and the number of AHUs for backup use refers to the number of AHUs provided to ensure the reliability of the capacity of the air conditioning system to adjust temperature.

In the foregoing invention, it is preferable that, if the degree of surplus is determined to be lower than the specified threshold, an operation setting used for the pump be stored, and that, when the flow rate of the chilled water fed out from the pump is decreased in the vicinity of the operation setting that is stored, the amount by which the flow rate of the chilled water is decreased be made smaller than that used during the previous control.

As described above, in the vicinity of the operation setting that has been stored, the amount by which chilled water is decreased per one time is decreased. Accordingly, fine control is performed in the vicinity of the operation setting that has been stored, and stable control is easily ensured.

In the foregoing invention, it is preferable that the chilled water circulation system further comprises: a primary chilled water circuit that connects the thermal source, a feed header, into which the chilled water fed out from the thermal source flows, and a return header, which feeds out the chilled water that has flowed into the thermal source, so that the chilled water can circulate; and secondary chilled water pipes that connects the feed header, the AHU and the return header so that the chilled water can circulate. It is also preferable that the pump include: a primary pump that feeds out the chilled water from the thermal source to the feed header; and a secondary pump that feeds the chilled water having a flow rate corresponding to the operating frequency of the power inverter, from the feed header to the AHU.

Effects of the Invention

The cold/chilled water circulation system of the present invention yields an effect in that, by controlling a pump on the basis of a degree of surplus of AHUs, a surplus can be ensured in the capacity of the AHUs to cool air, and the reliability of the capacity to adjust room-air temperature is ensured. Additionally, this system yields an effect in that, since control for decreasing the flow rate of the chilled water from the pump is performed if the degree of surplus is not lower than the specified threshold, power used for driving the pump can be decreased.

BRIEF DESCRIPTION OF THE DRAWINGS

FIG. 5 is a flowchart illustrating interruption control relating to a warning.

EXPLANATION OF REFERENCE NUMERALS

1 . . . Air conditioning system (Cold/chilled water circulation system), 10 . . . Thermal source, 11 . . . Primary feed header (Feed header), 12 . . . Primary return header (Return header), 13 . . . Primary pump, 14 . . . Primary cold/chilled water circuit, 20 . . . AHU, 21 . . . Two-way valve, 23 . . . Fan, 31 . . . Secondary feed header (Feed header), 32 . . . Secondary return header (Return header), 33 . . . Secondary pump, 35 . . . Cold/chilled water main pipe (Secondary cold/chilled water pipes), 42 . . . Control section

MODE FOR CARRYING OUT THE INVENTION

An air conditioning system having a cold/chilled water circulation system according to an embodiment of the present invention will be described with reference to FIGS. 1-5.

The present embodiment will be described using an example where an air conditioning system (chilled water circulation system) 1 according to the present invention is used for air conditioning for a data center. In the data center, many electronic apparatuses, such as servers and computers, comprising IT (Information Technology) devices and ICT (Information Communication Technology) devices, are arranged on floors F and an air conditioning system 1 is used in order to process the large quantity of heat generated by these electronic apparatuses.

Figure 1:
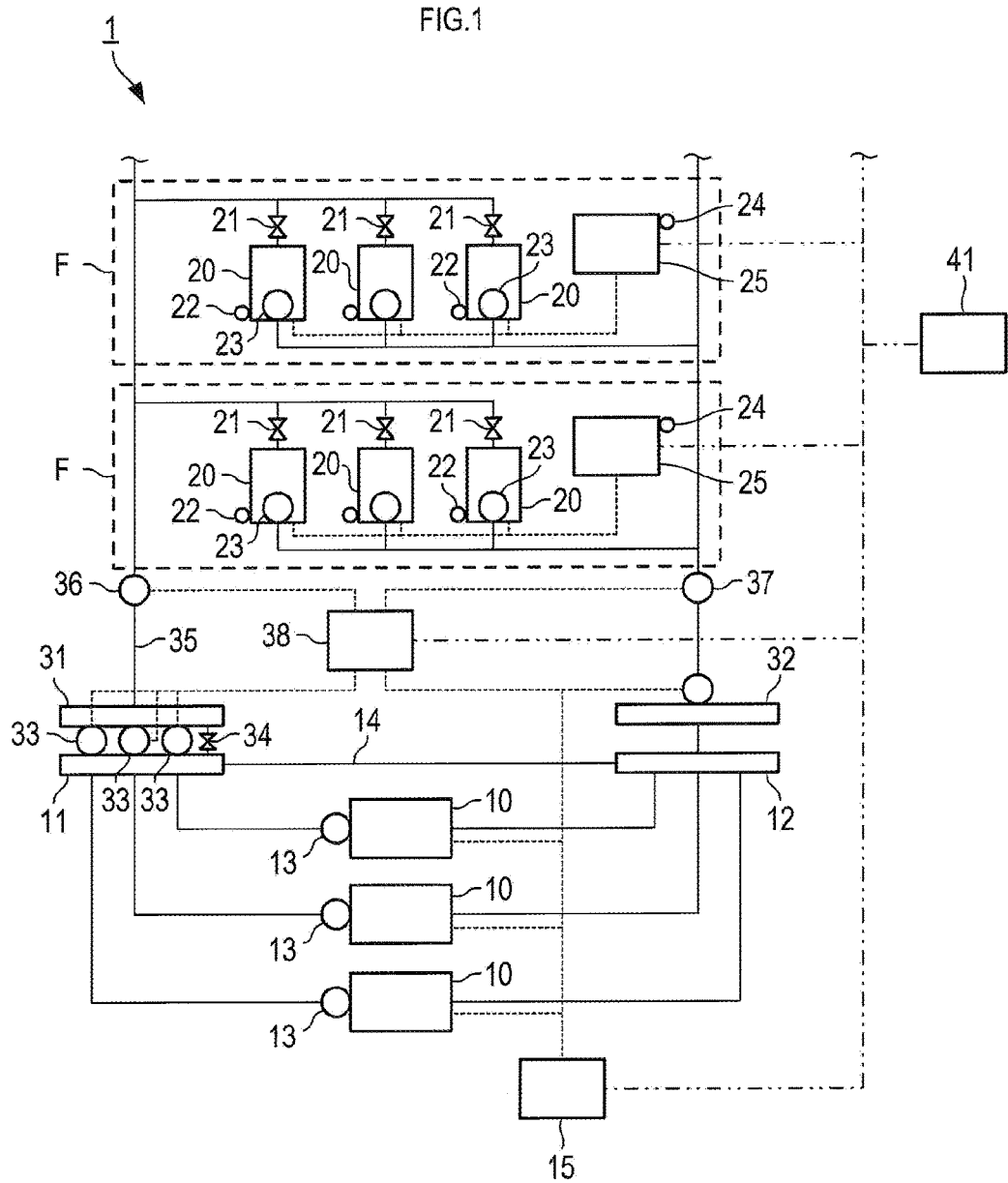
FIG. 1 is a schematic view illustrating the configuration of an air conditioning system according to an embodiment of the present invention.

As shown in FIG. 1, the air conditioning system 1 mainly comprises a plurality of thermal sources 10, a primary feed header (feed header) 11, a primary return header (return header) 12, a primary pump 13, a primary chilled water circuit 14, a thermal source controller 15, a plurality of AHUs (Air Handing Units) 20, AHU controllers 25, a secondary feed header (feed heater) 31, a secondary return header (return header) 32, a chilled water main pipe (secondary chilled water piping) 35, a secondary pump 33, a pump controller 38, and an integration controller 41.

The thermal sources 10 supply chilled water used by AHUs 20 to cool air in rooms. More specifically, the thermal sources 10 absorb heat from air in the rooms via AHUs 20, thereby cooling chilled water the temperature of which has increased, and feed it again to the AHUs 20 as chilled water of specified temperature. As an example of the thermal sources 10, a refrigerator such as an air-cooling chiller having, for example, a compressor, condenser, expansion valve, vaporizer, and fan part (not shown) can be used.

Chilled water supplied from the thermal sources 10 refers to chilled water the temperature of which is lower than that of air in the rooms. Therefore, when the temperature of air in the rooms is high, water of a temperature that is generally perceived as warm (warm water) may be supplied from the thermal sources 10. Additionally, the present embodiment has been described using an example where water is used as a heat medium supplied from the thermal sources 10. However, other heat media may be used and the type of heat medium, which conveys heat, is not limited.

The primary feed header 11 receives chilled water fed out from the thermal sources 10 and supplies chilled water to the secondary feed header 31. The primary return header 12 receives chilled water from the secondary return header 32 and feeds out chilled water to the thermal sources 10.

The primary chilled water circuit 14 connects the thermal sources 10, primary feed header 11, and primary return header 12, thus forming a passage through which chilled water circulates. The primary pumps 13 discharge chilled water to the primary feed header 11 from the thermal sources 10. The present embodiment is described using an example where the primary pumps 13 are arranged in the thermal sources 10. However, these pumps may be arranged independently from the thermal sources 10 and the arrangement positions thereof are not limited.

Figure 2:
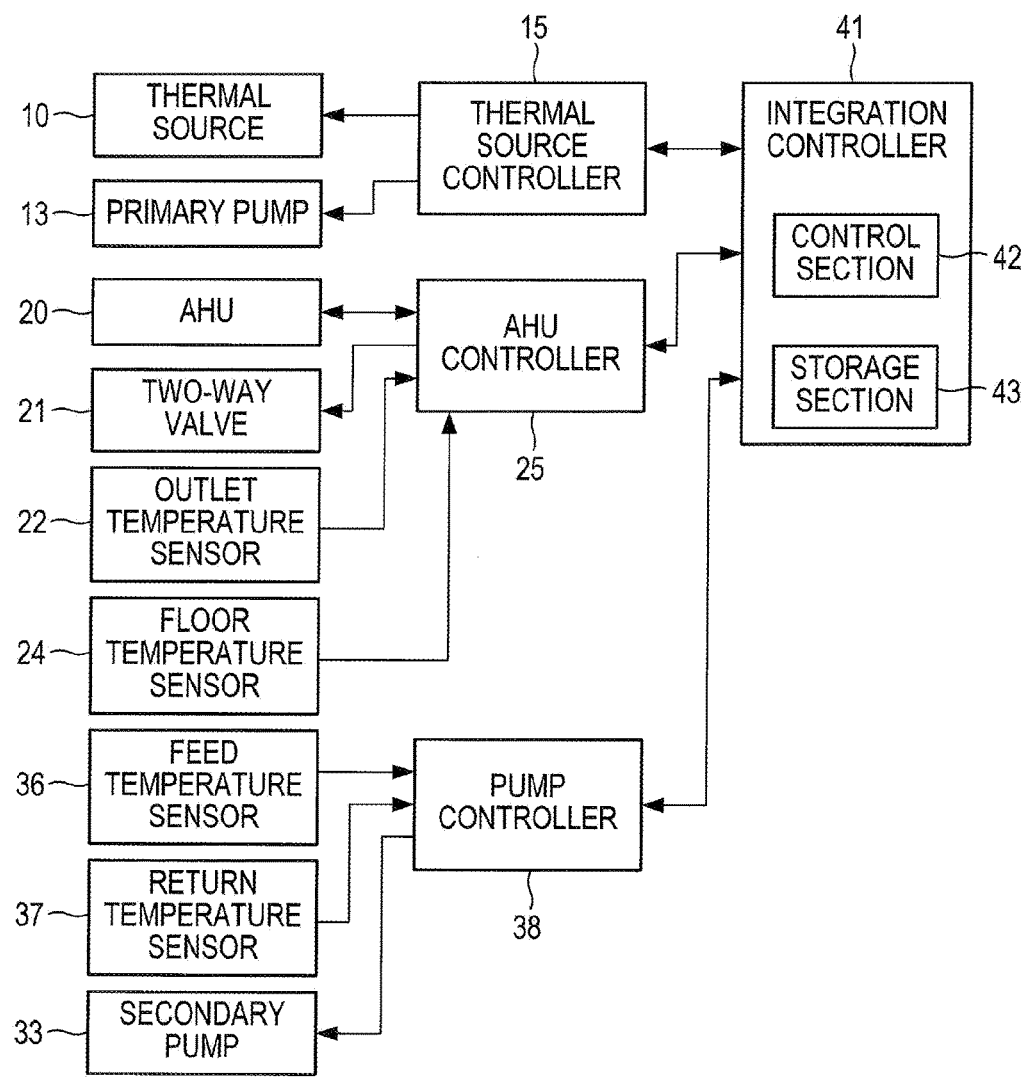
FIG. 2 is a block diagram illustrating an integration controller and so on in FIG. 1.

The thermal source controller 15 is, as shown in FIGS. 1, 2, a microcomputer comprising a CPU (Central Processing Unit), ROM, RAM, input/output interface, etc. The thermal source controller 15 controls the thermal sources 10 and primary pumps 13, and is controlled by the integration controller 41. For example, the thermal source controller 15 controls the temperature of chilled water fed out from each thermal source 10, and controls the flow rate of chilled water fed out from the corresponding primary pump 13.

As shown in FIG. 1, by using chilled water supplied from the thermal sources 10, the AHUs 20 cool air in rooms on floors, where temperature is high due to the heat of servers and so on. The present embodiment is described using an example where the plurality of AHUs 20 are arranged on the plurality of floors F of a data center.

Each AHU 20 is provided with: a two-way valve 21 that adjusts the flow rate of chilled water supplied from the thermal sources; and an outlet temperature sensor 22 that measures the temperature of air cooled by the AHU 20 and released onto the corresponding floor. As an example of the AHU 20, one mainly comprising, for example, a coil (not shown), which is a heat exchanger, and a fan 23, which ventilates the coil by supplying room air, can be given.

The secondary feed header 31 receives chilled water from the primary feed header 11, and supplies chilled water to the AHUs 20. Between the primary feed header 11 and secondary feed header 31 are secondary pumps 33 and return piping 34. The secondary pumps 33 feed out chilled water from the primary feed header 11 to the secondary feed header 31 and are driven by a power inverter controlled by the pump controller 38. The return piping 34 connects the primary feed header 11 and secondary feed header 31 and is configured such that excess chilled water fed to the secondary feed header 31 is returned to the primary feed header 11. The return piping 34 is provided with an adjustment valve that adjusts the flow rate of the chilled water.

The secondary return header 32 receives chilled water returned from the AHUs 20, and supplies chilled water to the primary return header 12. The chilled water main pipe 35 connects the secondary feed header 31, AHUs 20, and secondary return header 32, thus forming a passage through which chilled water flows. Arranged near the secondary feed header 31 and secondary return heater 32 along the chilled water main pipe 35 are a feed temperature sensor 36 and a return temperature sensor 37, respectively, each of which measures the temperature of the chilled water.

As shown in FIGS. 1, 2, each of the AHU controllers 25 is a microcomputer having a CPU (Central Processing Unit), ROM, RAM, input/output interface, etc., and controls the respective capacities of the AHUs 20 to cool air in the rooms on the floors. The AHU controllers 25 are controlled by the integration controller 41. The present embodiment is described using an example where one AHU controller 25 is arranged on one floor F and controls all the AHUs 20 arranged on the floor F.

The pump controller 38 is a microcomputer having a CPU (Central Processing Unit), ROM, RAM, input/output interface, etc., and controls the flow rate of chilled water fed out from the secondary pumps 33. The pump controller 38 is also controlled by the integration controller 41. More specifically, the pump controller controls the operating frequency of the power inverter, thereby controlling the flow rate of chilled water fed out from the corresponding secondary pump 33.

The integration controller 41 is a microcomputer having a CPU (Central Processing Unit), ROM, RAM, input/output interface, etc. The integration controller 41 outputs control signals to the thermal source controller 15, AHU controllers 25 and pump controller 38, and integrally controls the air conditioning system 1. A control program, stored in, for example, the ROM, causes the CPU to function as a control section 42, and causes, for example, the ROM and the like to function as a storage section 43. Control of the air conditioning system 1 by the integration controller 41, pump controller 38, AHU controllers 25, and thermal source controller 15 will be described later.

Figure 3:
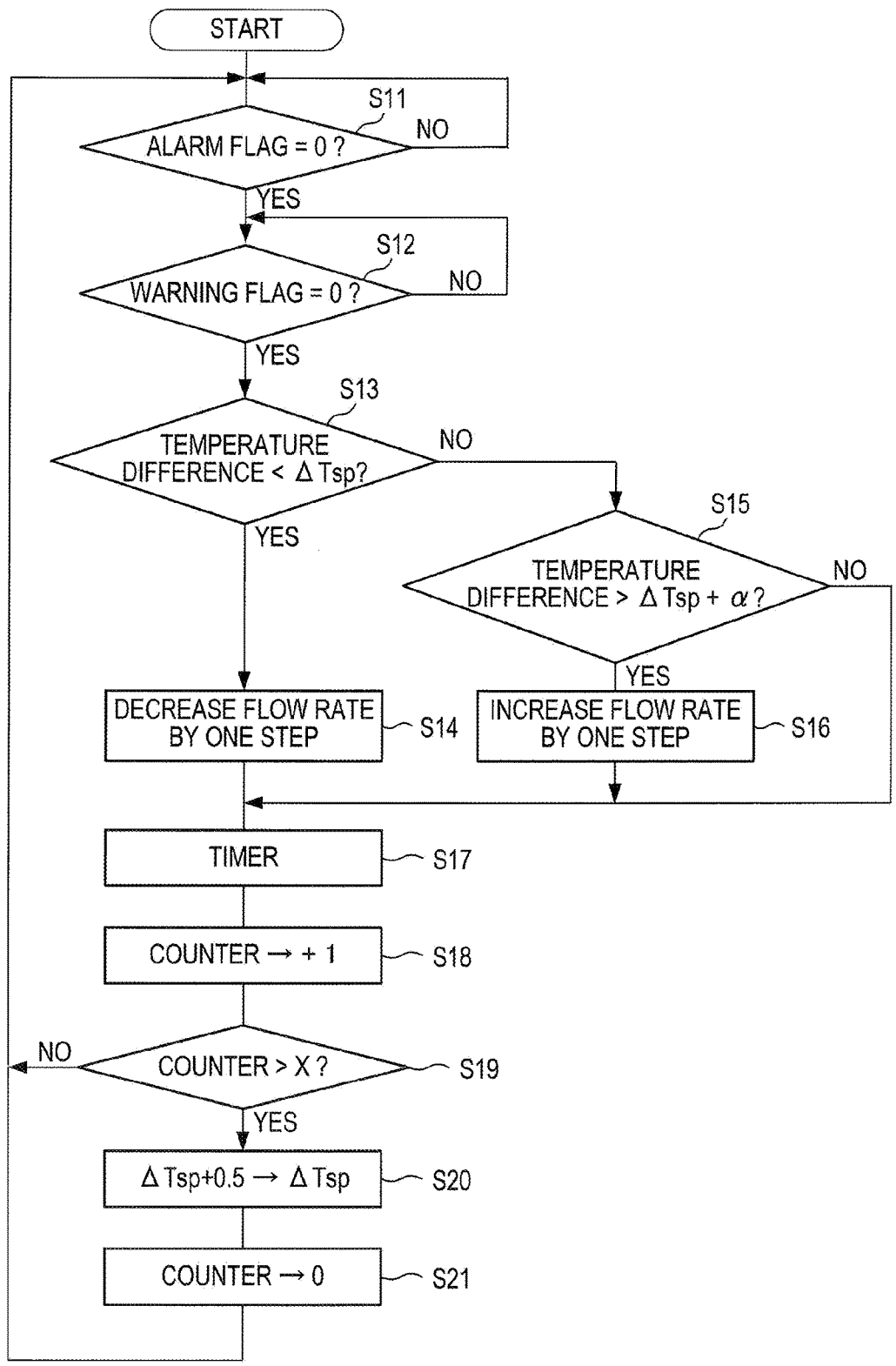
FIG. 3 is a flowchart illustrating control in the air conditioning system in FIG. 1.

Next, control in an air conditioning system 1 having the foregoing configuration will be described with reference to FIGS. 3, 4. First, referring to FIG. 3, control for normal operation of the air conditioning system 1 will be described.

When operation of the air conditioning system 1 is started, the integration controller 41 performs a process of determining whether an alarm flag stored in the storage section 43 is 0 (S11). If the alarm flag is 1, i.e., if the alarm flag is determined not to be 0 (NO), the determination in S11 is made again.

If the alarm flag is determined to be 0 (YES), the integration controller 41 performs a process of determining whether a warning flag stored in the storage section 43 is 0 (S12). If the warning flag is 1, i.e., if the warning flag is determined not to be 0 (NO), the determination in S12 is made again.

If the alarm flag is determined to be 0 (YES), the integration controller 41 performs a process of determining whether an outgoing and returning chilled water temperature difference is smaller than a ATsp (specified temperature difference). Here, the outgoing and returning chilled water temperature difference refers to a temperature difference obtained by subtracting the temperature of chilled water measured by the feed temperature sensor 36 from the temperature of chilled water measured by the return temperature sensor 37. In other words, it refers to a temperature difference obtained by subtracting the temperature of chilled water supplied to the AHUs 20 from the temperature of chilled water after heat exchange in the AHUs 20. A case where the outgoing and returning chilled water temperature difference is smaller than the ΔTsp indicates that the AHUs 20 have surplus capacity to adjust temperature. The outgoing and returning chilled water temperature difference may be calculated by the pump controller 38 or integration controller 41.

If the outgoing and returning chilled water temperature difference is determined to be smaller than the ΔTsp (YES), control is performed such that the flow rate of chilled water fed out from the secondary pump 33 is decreased by one step (S14). Specifically, the integration controller 41 performs the process of outputting a control signal, by which the operation frequency is decreased by one step, to the power inverter that drives the secondary pumps 33 via the pump controller 38. Consequently, power used for driving the secondary pump 33 is reduced.

In S13, if the outgoing and returning chilled water temperature difference is determined to be equal to or larger than the ΔTsp (NO), the integration controller 41 performs a processing of determining whether the outgoing and returning chilled water temperature difference is larger than the ΔTsp+α (S15). If the outgoing and returning chilled water temperature difference is determined to be larger than the ΔTsp+α (YES), the integration controller 41 performs control such that the flow rate of chilled water fed out from the corresponding secondary pump 33 is increased by one step (S16).

Specifically, the integration controller 41 performs a process of outputting a control signal, by which the operation frequency is increased by one step, to the power inverter that drives the corresponding secondary pump 33 via the pump controller 38. Consequently, the flow rate of chilled water supplied to the AHU 20 increases, so that the flow rate of chilled water used for heat exchange in the AHU 20 increases, thus enhancing the capacity of the AHU 20 to exchange heat.

In S15, if the outgoing and returning chilled water temperature difference is determined to be equal to or lower than the ΔTsp+α, that is, if the outgoing and returning chilled water temperature difference is determined to be equal to the ΔTsp (NO), integration controller 41 performs control such that the flow rate of chilled water fed out from the secondary pumps 33 is maintained. In other words, control for altering the flow rate of the chilled water is not performed.

After the control in S14 or S16 or the determination NO in S15, the integration controller 41 performs a time process in which a specified period T is measured (S17). Until the measurement of the specified period T finishes, the integration controller 41 does not perform the following process. That is, when the measurement of the specified period T finishes, the integration controller 41 performs the process of incrementing a count stored in the storage section 43. That is, the integration controller 41 performs the process of adding 1 to the count and storing in the counter the value resulting from the addition.

Next, the integration controller 41 performs a process of determining whether the value of the counter after the increment is larger than a specified value X (S19). If the value of the counter is determined to be larger than the specified value X (YES), the integration controller 41 performs a process of incrementing the value of ΔTsp by 0.5 (S20). Performing this process makes a determination in S13, which will be made later, easily result in YES. Accordingly, control for decreasing the flow rate of chilled water by one step is easily performed. Thereafter, the integration controller 41 performs a process of resetting the value of the counter, stored in the storage section 43, to 0 (S21).

After the process of resetting the value of the counter to 0, or if the value of the counter is determined to be equal to or larger than X in S19 (NO), the integration controller 41 returns to S11 again and repeats the processing described above.

In parallel with control during the foregoing normal operation, the integration controller 41 performs interruption control relating to an alarm and interruption control relating to warning, both of which will be described next. The interruption control relating to an alarm will be described first.

Figure 4:
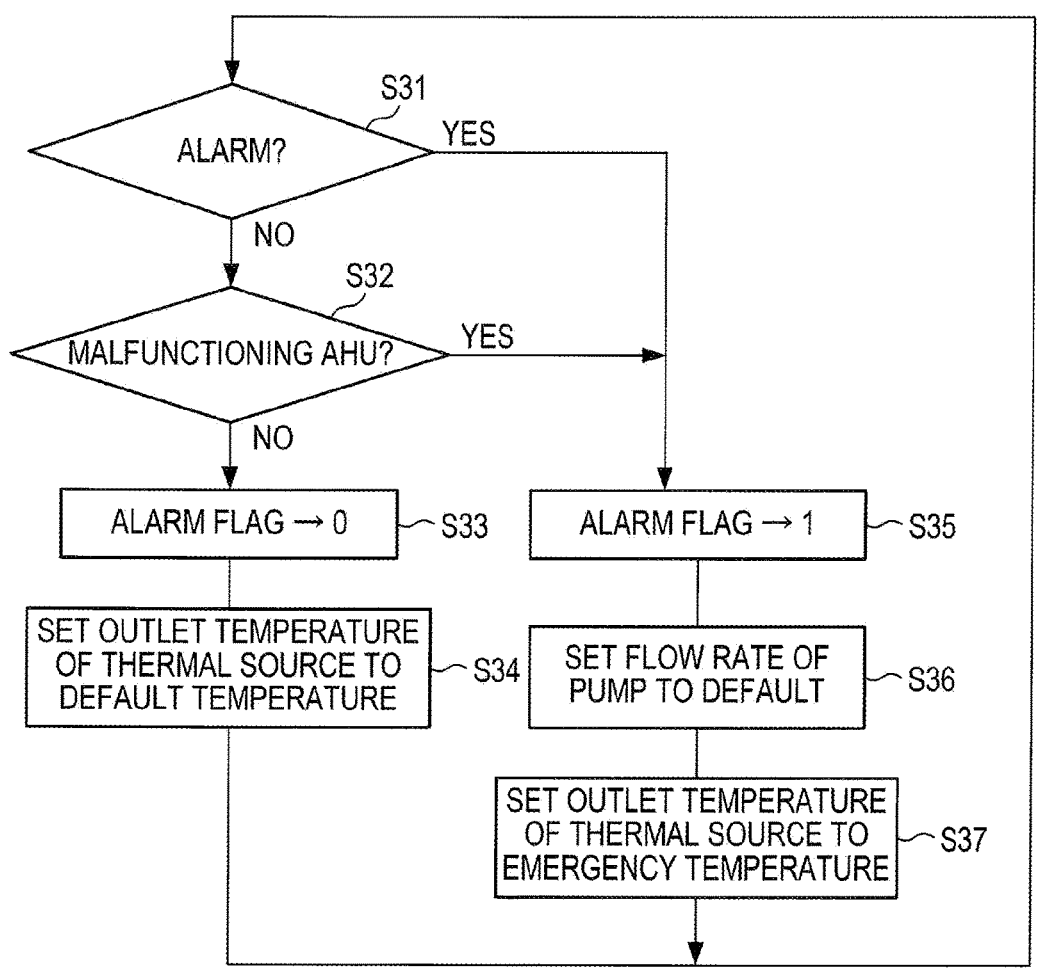
FIG. 4 is a flowchart illustrating interruption control relating to an alarm.

When the operation of the air conditioning system 1 starts, the integration controller 41 performs, as shown in FIG. 4, a process of determining whether an alarm has been given by each AHU controller 25 (S31). The alarm is given when the room air-temperature on the floor F, measured by a floor temperature sensor 24, exceeds an alarm threshold, and is provided by the AHU controller 25 or integration controller 41. The alarm threshold is the upper limit of the temperature in each room, at which the electronic apparatuses arranged on the floor F are not affected. If it is determined that an alarm has not been given (NO), the integration controller 41 then performs a process of determining whether there are any malfunctioning AHUs 20 (S32).

For example, each AHU controller 25 has grasped the respective states of the corresponding AHUs 20. The integration controller 41 acquires the states of the AHUs 20 from each AHU controller 25, thereby performing the process of determining whether there are any malfunctioning AHUs 20.

If it is determined that there aren't any malfunctioning AHUs 20 (NO), the integration controller 41 performs the process of setting the value of an alarm flag, stored in the storage section 43, to 0 (S33). Additionally, the integration controller 41 performs the process of outputting a control signal by which a discharge temperature of each thermal source 10 is set as a default temperature via the thermal source controller 15 (S34). In other words, the integration controller 41 outputs a control signal by which the target temperature of chilled water fed out from the thermal source 10 is altered to the specified default temperature. As an example of the default temperature, one stored in the integration controller 41 or thermal source controller 15 in advance can be given.

Conversely, if it is determined that an alarm has been given in S31 (YES), or if it is determined that there is a malfunctioning AHU 20 in S32 (YES), the integration controller 41 performs a process of setting the value of the alarm flag, stored in the storage section 43, to 1 (S35).

Next, the integration controller 41 performs a process of outputting a control signal by which the flow rate of chilled water fed out from the secondary pumps 33 via the pump controller 38 is set as a default flow rate (S36). That is, if the flow rate of chilled water fed out from the secondary pumps 33 has been altered from a default flow rate during the processes in S14 and S16 and a process in S47 described later, control for returning the flow rate to the default flow rate is performed.

Thereafter, the integration controller 41 performs a process of outputting a control signal by which the discharge temperature of the thermal sources 10 is set as an emergency temperature (specific temperature) via the thermal source controller 15 (S37). In other words, the integration controller 41 performs control such that the target temperature of chilled water fed out from the thermal source 10 is set to the emergency temperature. The emergency temperature is lower than the default target temperature of chilled water fed out from the thermal source 10, and is stored in the integration controller 41 or thermal source controller 15 in advance.

Upon completing the process in S34, in which the discharge temperature is set as the default temperature, or the process in S37, in which the discharge temperature is set as the emergency temperature, the integration controller 41 returns to S31 and repeats the processes described above.

Next, the interruption control relating to warning will be described. When operation of the air conditioning system 1 is started, the integration controller 41 performs, as shown in FIG. 5, a process of determining whether warning has been given by each AHU controller 25 (S41). Warning is given when the room air-temperature on the floor F exceeds a warning threshold (temperature threshold), and is provided by the AHU controller 25 or integration controller 41. The warning threshold is lower than the alarm threshold described above. If it is determined that warning has not been given (NO), the integration controller 41 returns to S41 again and performs the process of determining whether warning has been given.

If it is determined that warning has been given (YES), the integration controller 41 performs a process of calculating the degree of surplus (S42). The degree of surplus is obtained using at least one of the three calculation formulae described below.

$$1-(\text{the average value of the degrees of opening of the two-way valves}) \qquad (1)$$

$$1-[\text{the average value of (the rotation frequencies of the fans 23/the maximum frequency)}] \qquad (2)$$

$$\text{The average value of (set temperatures–measured temperatures)} \qquad (3)$$

Herein, the degree of opening of each two-way valve 21 is 0 when the valve 21 is fully closed and is 1 when it is fully open. As an example of the average value of the degrees of opening of the two-way valves 21, the average value of all the two-way valves 21 corresponding to the AHUs 20 arranged on each floor F can be given. Other than this, the average value of two-way valves 21 corresponding to AHUs 20 arranged in one of separate air-conditioned spaces provided on each floor F may be given.

The maximum frequency in the formula (2) refers to the maximum rotating frequency of each fan 23. Each of the set temperatures in the formula (3) refers to a target temperature for each room air-temperature on the floor F. Each of the measured temperature refers to the temperature in each room, measured by the floor temperature sensor 24. (The set temperatures–the measured temperatures) refers to an air temperature difference on the floor F. (An outlet-air set temperature as the target temperature of air released from each AHU–an outlet-air measured temperature) may be used therefor.

When the degree of surplus is calculated, the integration controller 41 performs a process of determining whether the degree of surplus is sufficiently high (S43). For example, the process of determining whether the degree of surplus is equal to or higher than a specified threshold or lower than it is performed.

Here, as an example of the specified threshold in a case where the degree of surplus is calculated using the foregoing formula (1) or (2), the value obtained from (the number of AHUs 20 for normal use/(the number of AHUs 20 for normal use+the number of AHUs 20 for backup use) can be given. Herein, the number of AHUs 20 for normal use refers to the minimum number of AHUs 20 required to cope with load in the air conditioning system 1, and the number of AHUs for backup use refers to the number of AHUs 20 provided to ensure reliability of the capacity of the air conditioning system 1 to adjust temperature.

If it is determined that the degree of surplus is sufficiently high (YES), the integration controller 41 performs a process of determining whether the value of the counter stored in the storage section 43 is 0 (S44). If it is determined that the value of the counter is 0 (YES), the integration controller 41 performs a process of setting the value of the count, stored in the storage section 43, to 1 (S45). Thereafter, the integration controller 41 performs a timer process in which a specified period T is measured (S46).

Conversely, if it is determined in S43 that the degree of surplus is not high (NO), or it is determined in S44 that the value of the count is not 0 (NO), the integration controller 41 performs control such that the flow rate of chilled water fed out from the secondary pumps 33 is increased by one step (S47). Specifically, the integration controller 41 outputs a control signal, by which the operating frequency is increased by one step, to the power inverter that drives the corresponding pump 33 via the pump controller 38.

After the flow rate of chilled water is increased by one step, the integration controller 41 performs a process of setting the value of the count, stored in the storage section 43, to 0 (S48). Thereafter, the integration controller 41 performs a process of replacing the value of the ATsp with the value of the outgoing and returning chilled water temperature difference ΔTsv obtained in the process in S47 (S49).

That is, the value of the ATsp that has become larger as a result of repetition of the process in S20 is replaced with the value of the outgoing and returning chilled water temperature difference ΔTsv actually obtained in the process in S47. Thereby, the value of the ΔTsp is inhibited from becoming too large. Consequently, the flow rate of chilled water fed out from the secondary pumps 33 is inhibited from becoming too low.

According to an air-conditioning system 1 with the foregoing configuration, the secondary pumps 33 are controlled based on the degree of surplus of the AHUs 20. It is possible to ensure surplus in the capacity to cool air by means of the AHUs 20. Accordingly, it is possible to ensure reliability of the capacity to adjust the temperature of the space on each floor F.

Additionally, if the degree of surplus is equal to or higher than the specified threshold, control for decreasing the flow rate of chilled water fed out from the secondary pumps 33 is performed, thus enabling a decrease in power used for driving the secondary pumps 33. Furthermore, since the flow rate of chilled water fed out from the secondary pumps 33 is decreased, the temperature of chilled water returning from the AHUs 20 is easily increased, thus facilitating an improvement in the efficiency of the thermal sources 10.

Obtaining the degree of surplus by using at least the formula (1), (2), or (3) described above makes it easy to further ensure reliability, and hence makes it easy to reduce power used to drive the secondary pumps 33. That is, it is considered that the capacity of each AHU 20 to cool air correlates with the degree of opening of the corresponding two-way valve 21, and that a surplus up to a full-open state in the degree of opening correlates with the degree of surplus described above. Therefore, obtaining the degree of surplus by using the degree of opening of the two-way valve 21 makes it possible to obtain the degree of surplus with higher accuracy. Similarly, it is considered that the rotating frequency of the fans 23 and the temperature difference between the set temperature and a measured temperature correlate with the capacity of the AHUs 20 to cool air. Therefore, obtaining the degree of surplus by using the rotating frequency of the fan 23 and the temperature difference between the set temperature and a measured temperature makes it possible to obtain the degree of surplus with higher accuracy.

Furthermore, obtaining the degree of surplus by using the formula (1), (2), or (3) described above makes it possible to express the degree of surplus as a numeric value of 0 to 1. Accordingly, a control process, such as comparing a degree of surplus with a specified threshold, after the degree of surplus is obtained is easily performed.

Additionally, the degree of opening of the two-way valve 21 is controlled such that an outlet temperature, which is the temperature of air released from the AHU 20, is equal to a desired value. Thereby, the outlet temperature is easily controlled so as to have the value set. Specifically, if the outlet temperature is higher than the value set for the outlet temperature, control is performed so as to increase the degree of opening of the two-way valve 21. Thereby, the flow rate of chilled water supplied to the AHU 20 is increased and, therefore, the outlet temperature is decreased. Accordingly, the temperature of air released from the AHU 20 is easily controlled so as to have the value set for the outlet temperature. Conversely, if the outlet temperature is lower than the value set for the outlet temperature, control is performed so as to decrease the degree of opening of the two-way valve 21. Thereby, the flow rate of chilled water supplied to the AHU 20 is decreased and, therefore, the outlet temperature is increased. Accordingly, the temperature of air released from the AHU 20 is easily controlled so as to have the value set for the outlet temperature.

The rotating frequency of the fan 23 is controlled such that the temperature of the space on the floor F is lower than a specified set threshold. Thereby, the temperature of the space on the floor F is easily controlled so as to be lower than the set threshold. Specifically, if the temperature of the space on the floor F is higher than the set threshold, the rotating frequency of the fan 23 is increased. Thereby, the flow rate of air released from the AHU 20 increases, so that the temperature of the space on the floor F is easily made lower than the set threshold. While the outlet temperature is stabilized in such a manner, the fan is operated at the lowest frequency so that the temperature in the corresponding room has a set level or below. Thereby, fan power can also be reduced.

Obtaining the degree of surplus for each floor F and controlling the flow rate of chilled water fed out from the secondary pumps 33 make it easy to ensure the reliability of the capacity to adjust the temperature of the space on the floor F. For example, even if the degree of surplus, obtained from one of a plurality of floors F, is determined to be lower than a specified threshold, control for increasing the flow rate of chilled water is performed, thereby making it easy to inhibit temperature increase on the floor F.

Additionally, specifying a specified threshold based on the number of AHUs 20 for normal use and the number of AHUs 20 for backup use makes it easy to further ensure the reliability of the capacity to adjust the temperature of the space on each floor F.

If the temperature of the space on the floor F exceeds the warning threshold, control for increasing the flow rate of chilled water fed out from the secondary pumps 33 is performed, thereby making the temperature of the space on the floor F less likely to exceed the alarm threshold. For example, if control for increasing the flow rate of chilled water after the temperature of the space on the floor F exceeds the alarm threshold is performed, the temperature of the space on the floor F exceeds the alarm threshold. Compared to this, by performing control for increasing the flow rate of chilled water after the temperature of the space on the floor F exceeds the warning threshold, which is lower than the alarm threshold, the temperature of the space on the floor F can be made less likely to exceed the alarm threshold.

If the temperature of the space on the floor F has a degree of surplus not lower than the specified threshold even after exceeding the warning threshold, control for increasing the flow rate of chilled water is performed after a time interval of specified period T. Thereby, power used for driving the secondary pumps 33 is easily reduced. For example, if the temperature of the space on the floor decreases below the warning threshold due to provision of a time interval of the specified period T, control for increasing the flow rate of chilled water is not performed. Therefore, compared to the case where the flow rate of chilled water is increased without providing the specified period T, power used for driving the secondary pumps 33 is reduced.

If the temperature of the space on the floor F exceeds the alarm threshold, the target temperature of chilled water cooled by the thermal sources 10 is immediately altered to the emergency temperature, thereby making it possible to immediately decrease the temperature of the space on the floor F below the alarm threshold.

By repeatedly storing the ATsp used when the flow rate of chilled water is decreased, i.e., by repeatedly learning the ATsp, power used for driving the secondary pumps 33 can be decreased, compared to the case where learning is not repeated.

In a case where the flow rate of chilled water fed out is altered by performing control such that the pressure of chilled water fed out from the secondary pumps 33 is equal to a target pressure, a specified pressure when the flow rate of chilled water is decreased is repeatedly stored, that is, the specified pressure is repeatedly learned. Thereby, power used for driving the secondary pumps 33 can be reduced, compared to the case where learning is not repeated.

Incidentally, control to increase the flow rate of chilled water fed out from the secondary pumps 33 may be performed only when at least either the respective degrees of opening of the two-way valves or the respective rotation frequencies of the fans 23 satisfy the corresponding upper limit threshold in all the AHUs 20. In this way, power used for driving the secondary pumps 33 in the air conditioning system 1 is easily reduced. That is, the period for which the flow rate of chilled water is increased is shortened, compared to the case where control is performed such that when at least either the degree of opening of the two-way valve 21 or the rotating frequency of the fan 23 satisfies the corresponding upper limit threshold in one AHU 20, the flow rate of chilled water fed out from the secondary pump 33 is increased. Accordingly, power used for driving the secondary pumps 33 can be reduced.

If it is determined that the degree of surplus is lower than the specified threshold, a process of storing in the storage section 43 an operation setting used for the secondary pumps 33 is performed, and a process of decreasing the flow rate of chilled water fed out from the secondary pumps 33 is performed. In this case, in the vicinity of the operation setting that has thus been stored, control may be performed such that the amount by which the flow rate of chilled water is decreased is smaller than that used during the previous control. Additionally, in the vicinity of the operation setting that has thus been stored, control may be performed such that intervals of control for decreasing the flow rate of chilled water are rendered longer than in other cases.

In the vicinity of the operation setting that has thus been stored, the amount by which chilled water is decreased per one time is decreased, and also intervals of control for decreasing the flow rate of chilled water are lengthened. Accordingly, fine control is performed soon after the operation setting has been stored, and stable control capacity is easily ensured.

It is understood that the technical scope of the present invention is not limited by the foregoing embodiment and various changes can be made within a range without departing from the spirit of the present invention. For example, the foregoing embodiment has been described using an example where the air conditioning system relating to the present invention is used in a data center. However, the target for use of the present invention is not limited to a data center, but may also include other facilities.

The invention claimed is:

1. A chilled water circulation system comprising:
   a thermal source that cools chilled water to a specified temperature;
   at least one AHU (Air Handling Unit), which is an air conditioner that cools air by heat exchange with the chilled water;
   a pump that feeds the chilled water from the thermal source to the at least one AHU;
   a controller that calculates a degree of surplus, which indicates a surplus capacity of the at least one AHU to cool the air, on the basis of information indicating the state of the at least one AHU,
   the controller being configured to:
      decrease a flow rate of the chilled water fed out from the pump when the degree of surplus calculated by the controller is equal to or higher than a specified threshold; and
      increase the flow rate of the chilled water fed out from the pump when the degree of surplus calculated by the controller is smaller than the specified threshold.

2. The chilled water circulation system according to claim 1, wherein each AHU of the at least one AHU comprises a two-way valve that controls the flow rate of the chilled water flowing in the AHU, and a fan that blows the air to be heat-exchanged in the AHU, wherein the information indicating the state of the AHU is at least one or more of the following: a degree of opening of the two-way valve, a rotating frequency of the fan, or an air temperature difference between a temperature set for the air released from the AHU and a measured temperature of the air, or a combination thereof.

3. The chilled water circulation system according to claim 2, wherein for each AHU of the at least one AHU, the controller is configured to control the degree of opening of the two-way valve such that an outlet temperature, which is the measured temperature of the air released from the AHU, is equal to a desired value set for the outlet temperature.

4. The chilled water circulation system according to claim 2, wherein for each AHU of the at least one AHU, the controller is configured to control an operating frequency of the fan such that a temperature in a specific section where the AHU is arranged is lower than a specified set threshold.

5. The chilled water circulation system according claim 2, wherein the at least one AHU comprises a plurality of AHUs, wherein AHUs of the plurality of AHUs are separately arranged in a plurality of sections, and wherein the controller is configured to perform control such that when at least either respective degrees of opening of two-way valves or respective rotating frequencies of fans of the plurality of AHUs satisfy an upper limit threshold in all the AHUs arranged in the sections, the flow rate of the chilled water fed out from the pump is increased.

6. The chilled water circulation system according to claim 2, wherein the at least one AHU comprises a plurality of AHUs, wherein AHUs of the plurality of AHUs are separately arranged in a plurality of sections, and wherein the controller is configured to perform control such that when at least either respective degrees of opening of two-way valves or respective rotating frequencies of fans of the plurality of AHUs satisfy a corresponding upper limit threshold in a certain number of the AHUs arranged in the sections, the flow rate of the chilled water fed out from the pump is increased.

7. The chilled water circulation system according to claim 1, comprising a temperature sensor that measures the temperature in a room where the at least one AHU is provided, wherein the controller is configured to perform control such that when the temperature in the room measured by the temperature sensor exceeds a temperature threshold, the flow rate of the chilled water fed out from the pump is increased.

8. The chilled water circulation system according to claim 7, wherein the controller is configured to perform control such that, if the degree of surplus is not lower than the specified threshold even after the room-air temperature measured by the temperature sensor exceeds the temperature threshold, the flow rate of the chilled water fed out from the pump is increased after a lapse of a specified period.

9. The chilled water circulation system according to claim 7, wherein the controller is configured to perform control such that if the room-air temperature measured by the temperature sensor exceeds an alarm threshold, which is higher than the temperature threshold, a target temperature for the chilled water cooled by the thermal source/thermal sources is altered to a specific temperature, which is lower than the specified temperature.

10. The chilled water circulation system according to claim 1, wherein the controller is configured such that an operating frequency of a power inverter is controlled so that a target value for a chilled water temperature difference between a feed temperature, which is the temperature of the chilled water fed to the at least one AHU, and a return temperature, which is the temperature of the chilled water flowing out from the at least one AHU, is equal to a specified temperature difference, and such that control for decreasing the flow rate of the chilled water is performed by altering the specified temperature difference after a specified interval of control and the specified temperature difference after the alteration is stored.

11. The chilled water circulation system according to claim 5, wherein the controller is configured to calculate: 1 minus (an average value of the degrees of opening of the two-way valves of the plurality of AHUs); 1 minus [an average value of (the rotating frequencies of the fans of the plurality of AHUs divided by a maximum frequency)]; and an average value of the set temperature for each AHU of the plurality of AHUs minus the measured temperature for each AHU of the plurality of AHUs, and to obtain at least one of these averages as the degree of surplus.

12. The chilled water circulation system according to claim 11, wherein AHUs of the plurality of AHUs are arranged separately in sections of a sectioned space, and wherein the degree of surplus is obtained on the basis of the AHU arranged in each of the sections.

13. The chilled water circulation system according to claim 11, wherein the controller is configured such that, if the degree of surplus is 1 minus (the average value of the degrees of opening of the two-way valves of the plurality of AHUs), or 1 minus [the average value of (the rotating frequencies of the fans of the plurality of AHUs divided by the maximum frequency)], the specified threshold of the degree of surplus is set to [a number of AHUs for normal use divided by (the number of AHUs for normal use plus a number of AHUs for backup use)].

14. The chilled water circulation system according to claim 1, wherein the controller is configured such that, when the degree of surplus is lower than the specified threshold, an operation setting used for the pump is stored, and wherein, when the flow rate of the chilled water fed out from the pump is decreased in a vicinity of the operation setting that is stored, an amount by which the flow rate of the chilled water is decreased is made smaller than that used during the previous control.

15. The chilled water circulation system according to claim 1, further comprising:
a feed header, into which the chilled water fed out from the thermal source flows, and a return header, which feeds out the chilled water that is to flow into the thermal source; and
a primary chilled water circuit that connects the thermal source, the feed header, and the return header so that the chilled water can circulate; and secondary chilled water pipes that connect the feed header, the at least one AHU, and the return header so that the chilled water can circulate,
wherein the pump comprises:
a primary pump that feeds out the chilled water from the thermal source to the feed header; and
a secondary pump that feeds the chilled water having a flow rate corresponding to an operating frequency of a power inverter, from the feed header to the at least one AHU.

16. The chilled water circulation system according to claim 1, wherein the pump is configured to feed out the chilled water having a flow rate corresponding to an operating frequency of a power inverter, and wherein the controller is configured to control the operating frequency of the power inverter so that a target pressure for the chilled water fed out from the pump is equal to a specified pressure, and to perform control for decreasing the flow rate of the chilled water by altering the specified pressure after a specified interval of control and store the specified pressure after the alteration.

17. The chilled water circulation system according to claim 1, wherein the controller is configured to perform control for increasing or decreasing the flow rate of the chilled water by altering a pressure setting so that a target pressure of the chilled water fed out from the pump is equal to a specified pressure.

* * * * *